(12) United States Patent
Ogadhoh et al.

(10) Patent No.: US 8,404,403 B2
(45) Date of Patent: Mar. 26, 2013

(54) MASK DESIGN AND OPC FOR DEVICE MANUFACTURE

(75) Inventors: Shem Ogadhoh, Beaverton, OR (US); Raguraman Venkatesan, Portland, OR (US); Kevin J. Hooker, Hillsboro, OR (US); Sungwon Kim, Portland, OR (US); Bin Hu, Portland, OR (US); Vivek Singh, Portland, OR (US); Bikram Baidya, Hillsboro, OR (US); Prasad Narendra Atkar, Hillsboro, OR (US); Seongtae Jeong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 12/824,037

(22) Filed: Jun. 25, 2010

(65) Prior Publication Data

US 2011/0318672 A1 Dec. 29, 2011

(51) Int. Cl.
*G03F 1/68* (2012.01)
(52) U.S. Cl. ........................................................ 430/5
(58) Field of Classification Search .............. 430/5, 322, 430/323; 716/55, 56
See application file for complete search history.

(56) References Cited

U.S. PATENT DOCUMENTS

| 6,573,027 | B1 | 6/2003 | Imai |
| 2004/0006757 | A1 | 1/2004 | Chen et al. |
| 2005/0088633 | A1 | 4/2005 | Borodovsky |
| 2008/0069432 | A1 | 3/2008 | Hsu et al. |
| 2008/0097729 | A1* | 4/2008 | Jung et al. ........................ 703/1 |
| 2008/0148217 | A1* | 6/2008 | Park .............................. 716/21 |
| 2008/0166639 | A1 | 7/2008 | Park et al. |
| 2009/0040483 | A1 | 2/2009 | Deng et al. |

OTHER PUBLICATIONS

International Search Report and Written Opinion for Application No. PCT/US2011/036764 dated Mar. 21, 2012, 11 pages.

* cited by examiner

*Primary Examiner* — Stephen Rosasco
(74) *Attorney, Agent, or Firm* — Blakely, Sokoloff, Taylor & Zafman LLP

(57) ABSTRACT

Described herein is mask design and modeling for a set of masks to be successively imaged to print a composite pattern on a substrate, such as a semiconductor wafer. Further described herein is a method of double patterning a substrate with the set of masks. Also described herein is a method of correcting a drawn pattern of one of the mask levels based on a predicted pattern contour of the other of the mask levels. Also described herein is a method of modeling a resist profile contour for a mask level in which photoresist is applied onto a inhomogeneous substrate, as well as method of predicting a resist profile of a Boolean operation of two masks.

31 Claims, 15 Drawing Sheets

MASK DESIGN AND OPC FOR DEVICE MANUFACTURE

TECHNICAL FIELD

This disclosure relates generally to the field of lithographic masks for the manufacture of microelectronic devices, and more particularly to design of a set of masks to be successively imaged to print a target pattern in a single level of the device (e.g., double patterning).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

A photolithographic mask comprises geometric patterns of polygons corresponding to the circuit components to be integrated onto a wafer. The patterns used to create such masks are typically generated utilizing CAD (computer-aided design) programs via an EDA (electronic design automation) process. Most CAD programs follow a set of predetermined design rules in order to position the polygons to create functional masks. These rules are set by manufacturing process and circuit design limitations. For example, design rules define the space tolerance between circuit components (such as gates, capacitors, etc.) or interconnect lines to ensure a high device yield. The design rule limitations are typically referred to as "critical dimensions" (CD). A CD of a circuit can be defined as the smallest length of a line or trench or the smallest space between two lines or two trenches. Thus, the CD determines the overall size and density of the designed circuit.

Recently device scaling has outpaced the development of lithography systems (e.g., scanners). Patterning interconnect geometries, for example, at the 22 nm node, using a 193 nm wavelength scanner may require a nesting of every narrow drawn line to force a circuit design to an optimal pitch (e.g., having a design-rule minimum space CD for every minimum CD line) with several compliance features and a drawing of large end-to-ends in an effort to reduce the mask error enhancement factor (MEEF) of the lithographic process to an acceptable level for the lithographic technology node. The resulting increase in circuit footprint can, however, negate the benefit of scaling the CD down to the 22 nm technology node.

DETAILED DESCRIPTION

Figure 1:
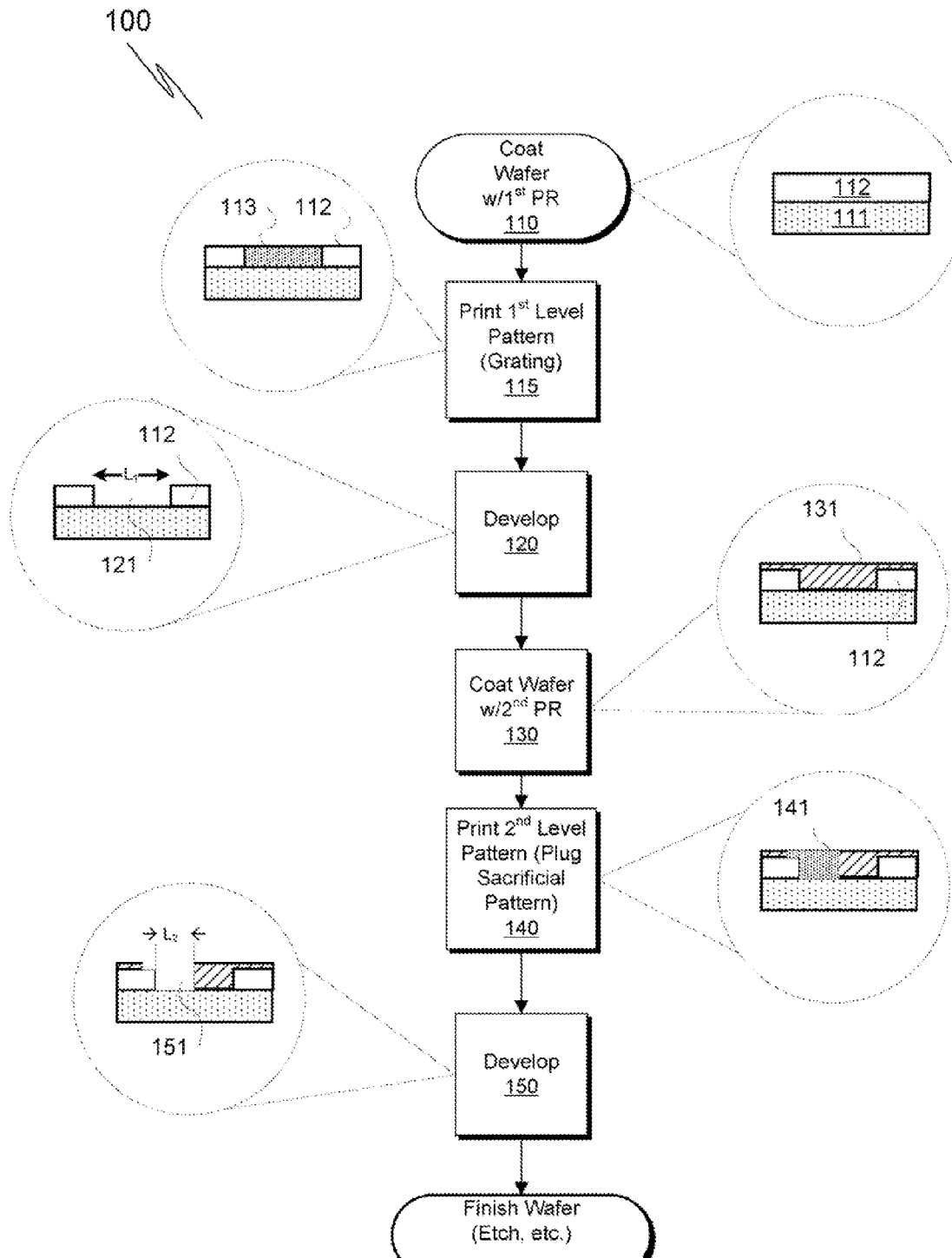
FIG. 1 illustrates a flow diagram depicting selected operations in a successive imaging of the set of masks to lithographically print a composite pattern on a substrate, in accordance with an embodiment.

Described herein is mask design and modeling for a set of masks to be successively imaged to print a composite pattern on a substrate, such as a semiconductor wafer. Further described herein is a method of double patterning a substrate with the set of masks. Also described herein is a method of correcting a drawn pattern of one of the mask levels based on a predicted pattern contour of the other of the mask levels. Further described herein is a method of modeling a resist profile contour for a mask level in which photoresist is applied onto a inhomogeneous substrate, as well as method of predicting a resist profile of a Boolean operation of two masks.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, levels, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The multiple patterning mask design embodiments described herein generate first and second masks which are to be successively printed on a substrate at a first masking level and a second masking level, respectively. Generally, the first mask pattern is synthesized through an addition of a sacrificial enabling pattern, at least some of which is to be printed onto the substrate by the lithography system at a first masking level, to a drawn design target pattern and thereby approximate a grating pattern. This grating pattern is then used to create a first level mask pattern that includes the target pattern, as a subset of the grating pattern. The second mask is generated based on at least the enabling pattern to eliminate, from the printed first level, the sacrificial enabling pattern. As such, it should be appreciated that the double patterning described herein is distinct from conventional techniques which decompose a target pattern into pattern subsets which are printed at separate levels. Rather, embodiments herein print the entire target pattern as well as the sacrificial enabling pattern in a single patterning level and then use the second patterning level to remove the sacrificial enabling pattern from a substrate.

Thus, rather than seeking to reduce a target pattern's density through the use of multiple mask imaging, embodiments herein leverage a second patterning operation to enable the imaging performance for a target pattern to be improved (e.g., by a increasing a regularity of edges) through the printing of sacrificial features onto the substrate. Absent the second patterning operation, such enabling features would not be sacrificial and the device design rules would need to be modified to incorporate permanent patterning artifacts. However, as described further elsewhere herein, embodiments of the present invention require little, if any, modification of device design rules.

As one of ordinary skill in the art will appreciate, the multiple pattern mask designs described herein may be utilized to print a double pattern on a substrate using a wide variety of photolithographic patterning techniques and systems. As one example, FIG. 1 depicts a "grating and plug" double patterning method 100. FIG. 1 illustrates selected operations of the grating and plug double patterning method 100 along with an exemplary cross-section representation of a substrate as it is processed through the selected operations. The grating and plug double patterning method 100 begins at operation 110 with coating a wafer 111 with a first layer of photoresist 112. Any conventional coating process and photoresist (negative or positive) known in the art may be employed.

At operation 115, a first mask is printed as the first patterning level to expose a trench region 113 of the first photoresist layer 112. In the exemplary embodiment, the first level pattern approximates a grating and includes a target pattern comprising bidirectional polygons, as discussed in detail elsewhere herein. Any lithography system known in the art may be used to image the first patterning level on the wafer 111, such as but not limited to, conventional UV-illuminated steppers or scanners employing a 193 nm wavelength radiation source. In alternative embodiments, shorter wavelengths (e.g., 157 nm or an extreme ultraviolet (EUV)) may also be employed. At operation 120, the first photoresist layer 112 is developed and/or baked to form the first level pattern topography. The trench 121 is formed in the first photo resist layer 112 having a longest dimension $L_1$ longer than the target pattern with a shortest dimension (CD) equal to a fraction of the imaging wavelength $\lambda/x$ where x is, for example, at least 4. As discussed further elsewhere herein, features having a smaller CD (and resulting in a higher MEEF) have been subsumed into the grating approximation. At operation 130, the wafer 111 is coated with a second layer of photoresist 131, substantially filling the patterned topography (e.g., trenches) present in the first layer of photoresist 112. Depending on the embodiment, the second layer of photoresist 131 may be of the same or different composition as that employed for the first layer of photoresist 112.

At operation 140, a second mask is printed as the second patterning level to expose a portion 141 of the second photoresist layer 131. In the exemplary embodiment, the second level pattern reduces the grating printed at the first pattern layer to the target pattern, as further discussed elsewhere herein. In the grating and plug double patterning method 100 where the first level pattern is to form trench regions 113, the second level pattern "plugs" the portion of the trench regions 113 which do not correspond to a target pattern. Prior to the operation 140, the first photoresist layer 112 is rendered non-photosensitive using various techniques, such as a hard bake or chemical treatment. Any lithography system known in the art may be employed at operation 140, such as but not limited to, UV-based steppers or scanners employing 193 nm, 157 nm or an extreme ultraviolet (EUV) wavelength radiation source. In the preferred embodiment, the wavelength employed at operation 140 is the same as that employed at operation 115.

At operation 150 the second photoresist layer 131 is developed and/or baked to form the target pattern with the remaining portions of both the first and second resist layers 112, 131. As shown, the second level pattern has a trench 151 with a longest length $L_2$ that is now to be equal to the polygon target. With the shortened length (minimum end-to-ends are now present), the trench 151 is to retain the shortest length CD equal to that which was printed at the first level (e.g., a fraction of the imaging wavelength). Yet, because this CD and end-to-end spacing is a result of overlap between the first and second resist layer 112, 131, the second level patterning may also have a low MEEF (e.g., edges having dimensions greater than those of the trench 151). Following operation 150, the grating and plug double patterning method 100 is substantially complete and the wafer may be further processed as known in the art (etch, etc.).

While the exemplary grating and plug double patterning method 100 illustrates one application whereby trenches formed in the first level patterning are subsequently filled and partially reopened, the multiple patterning techniques described herein may also be applied to double patterning techniques employing a single layer of resist. For example, the first mask level described herein may also be applied to print a grating approximation comprising unexposed lines which include both the target pattern and the sacrificial enabling pattern and the second mask level described may also be applied to remove the sacrificial unexposed lines to arrive at the target pattern.

Figure 2:
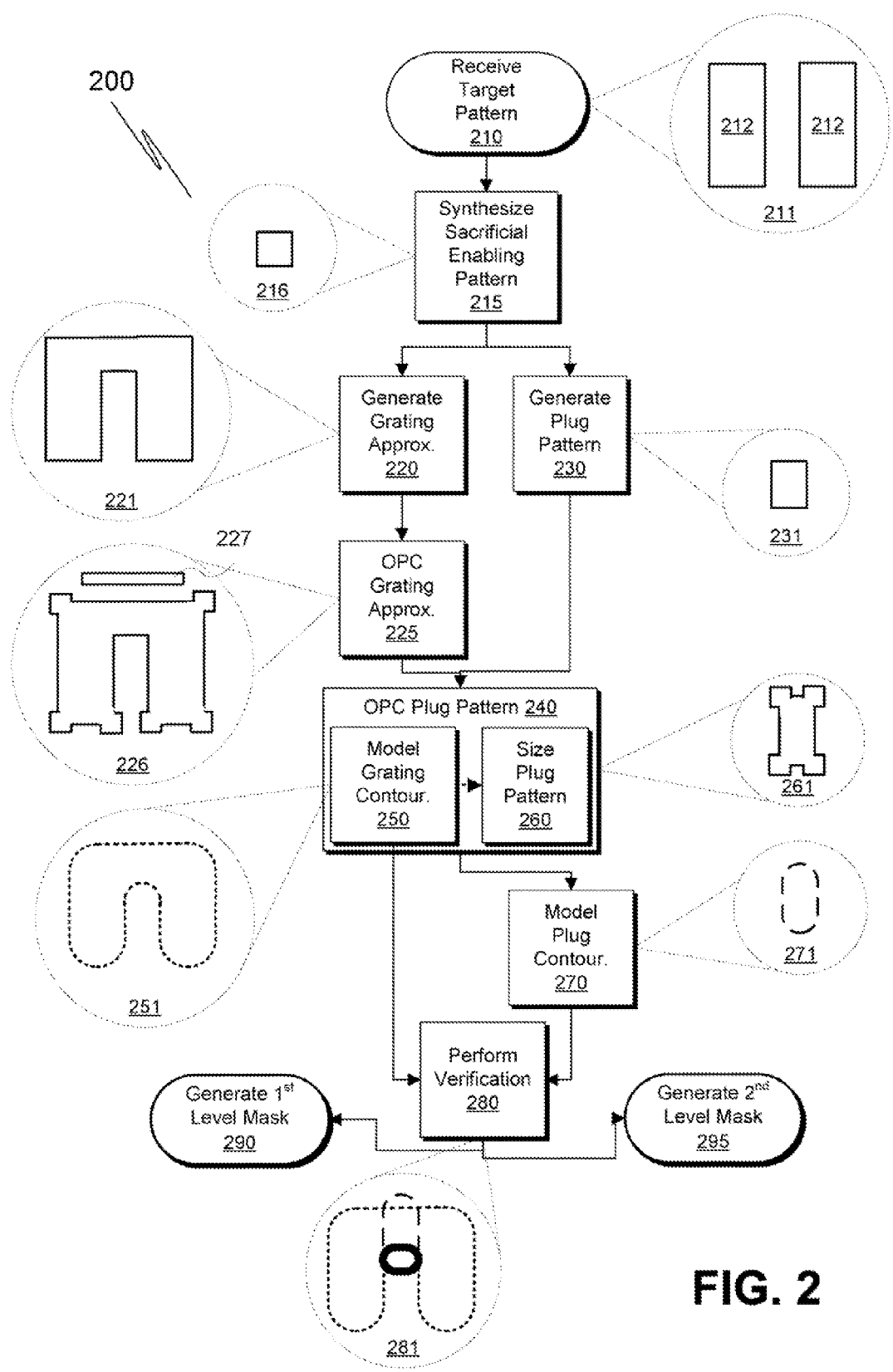
FIG. 2 illustrates a flow diagram depicting selected operations in the design generation of a set of masks to be successively imaged to print a composite pattern, in accordance with an embodiment.

FIG. 2 illustrates a mask design and generation method 200 for composing polygons of a first mask level and a second mask level into a target pattern of polygons to be formed on a substrate by sequentially printing the first mask level and the second mask level. Method 200 begins at operation 210 with receipt of a drawn design layout, for example as generated by a layout description language such as GDS-II or OASIS. FIG. 2 also illustrates an exemplary target pattern 211 representing a portion of an interconnect design, for example, as received from an IC designer, which is to be reproduced onto a level of a semiconductor wafer. The target pattern 211 includes the polygons 212 which are eventually to be faithfully imaged onto the wafer at the designed dimensions by lithographic printing. In an embodiment, the target pattern 211 is bidirectional, including polygons having a longest length in two directions.

Figure 3A:
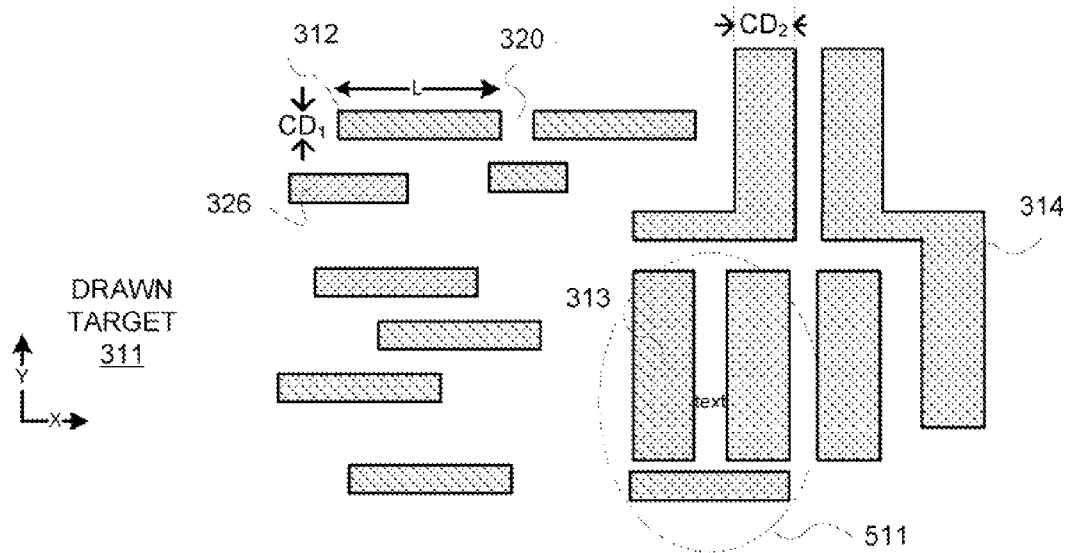
FIG. 3A illustrates a layout view an exemplary drawn target pattern, in accordance with an embodiment.

FIG. 3A further illustrates an exemplary target pattern 311, as drawn. As shown, the polygon 312 has a longest length L along the x-dimension and a shortest length, $CD_1$ along the y-dimension. The polygon 313 has a longest length along the y-dimension and a shortest length along the x-dimension such that the target pattern 311 is bidirectional. In the exemplary embodiment depicted in FIG. 3A, the target pattern 311 further includes polygon 314 with segments which run along both the x and y dimensions.

Returning to FIG. 2, at operation 215 a sacrificial enabling pattern is synthesized, based on the target pattern. The sacrificial enabling pattern is to be added to the target pattern (e.g., with a Boolean OR operation) to improve imaging performance of the first mask level for a given lithographic tool beyond what would be achieved with a mask including only the target pattern. For example, a sacrificial enabling pattern 216 containing a single polygon is generated, to have a particular position, shape and size based on the input target pattern 211. Although a number of rules and objectives may control generation of the sacrificial enabling pattern, in one embodiment, the generation of the enabling pattern 216 is performed with an objective function that drives the target pattern 211 to increase a regularity of edges toward an approximation of a diffraction grating. In a particular embodiment, at operation 215, a plurality of sacrificial enabling polygons are generated which result in both the grating pattern (including the sacrificial polygons) and the second level pattern used to remove the sacrificial polygons from the grating pattern having a mask error enhancement factor (MEEF) below that of the target pattern. Within this bound, sacrificial polygons may be synthesized to drive an arbitrary target pattern to converge at a grating pattern which can be imaged and then "cleaned up" with a second patterning more easily than directly imaging only the target pattern.

At operation 220, a Boolean OR operation is performed on the drawn target pattern 211 and the sacrificial enabling pattern 216 to generate a synthesized grating pattern 221. As further depicted in FIG. 3B, a synthesized diffraction grating pattern 321 is a Boolean OR of the drawn target pattern 311 of FIG. 3A and a sacrificial enabling pattern 316 (e.g., generated at operation 215 of FIG. 2). In one particular embodiment, the enclosed polygons are to form open regions in a mask with the surrounding region to be lower transmittance (i.e., chrome). The synthesized diffraction grating pattern 321 includes polygons having a minimum pitch resolvable by the optical projection system, $Pitch_G$, and defines a shortest length of all polygons in one of the two mask dimensions (e.g., $CD_1$). It will be appreciated by those of ordinary skill in the art that a diffraction grating pattern can be printed with a minimum pitch smaller than is possible for a non-periodic pattern. It is therefore possible to print the target polygons 312, as embedded within a grating pattern, with a reduced $CD_1$ (or with a reduced spacing, $S_1$, along the y-dimension between adjacent polygons 312).

Figure 3B:
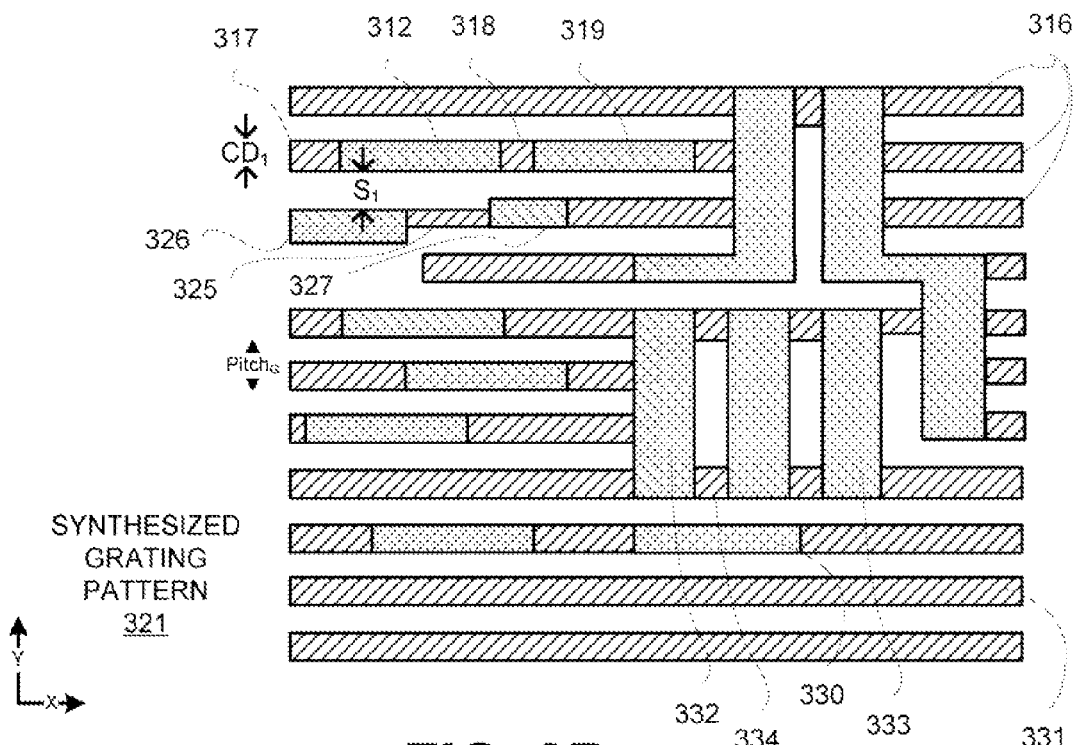
FIGS. 3B and 3C illustrate layout views of a set of masks to be generated and successively imaged to print the target pattern illustrated in FIG. 3A on a substrate, in accordance with an embodiment.

In one embodiment, as illustrated in FIG. 3B, the sacrificial enabling pattern 316 extends a first length of the target polygon 312 with an enabling polygon 317 has a shortest length (CD) that is no greater than that of the target polygon 312. As shown, the enabling polygon 317 and the target polygon 312 are drawn to substantially the same critical dimension ($CD_1$). Extension of the target polygon 312 with the enabling polygon 317 serves to improve the edge regularity or periodicity of the synthesized grating pattern 321 by extending the longest edge of the target polygon 312 to be adjacent to the entirety of the longest edge of the target polygon 327.

In another embodiment, also illustrated in FIG. 3B, an enabling polygon 318 joins the target polygon 312 to an adjacent target polygon 319 to eliminate the end-to-end space 320 present in the drawn target pattern 311 (FIG. 3A). With the joining of adjacent target polygons, the sacrificial enabling pattern 316 may greatly reduce the MEEF of the first pattern level, particularly where the end-to-end space 320 is a sized at the design rule minimum space. This elimination of minimum end-to-end spaces, along with the ability to print grating structures at a reduced pitch, is an important aspect of the double patterning methods described herein.

In further embodiments, end-to-end spaces between target polygon having different CDs are also advantageously eliminated. Enabling polygon 325, for example, eliminates an end-to-end space between the target polygon 326 and the target polygon 327 even though the target polygon 326 has a larger CD than the target polygon 327 and is also offset from the target polygon 327 in the y-dimension. Nevertheless, a diffraction grating is approximated by drawing the enabling polygon 325 with a first length to join the target polygons 326, 327 and with a second length equal to the y-dimension overlap between the target polygons 326, 327. As such, the shortest length of the enabling polygon 325 is smaller than that of either the target polygons 326, 327. For particular embodiments where the shortest length of the polygon 327 is equal to the design rule minimum dimension (e.g., $CD_1$), the shortest drawn length of the enabling polygon 325 is below the minimum dimension design rule for the drawn target pattern 311. Such sub-design rule connectors are created to eliminate pull-back concerns due to high MEEF as well as eliminate mask manufacturing inspection constraints. In particular embodiments, sub-design rule connectors like the enabling polygon 325 are sized during a subsequent correction step (e.g., OPC operation 225 discussed elsewhere herein) to the minimum size required at mask manufacture. Because the enabling polygon 325 will likely be sub-resolution when imaged onto a wafer (e.g., operation 115 of FIG. 1), the enabling polygon 325 patterns marginally, if at all, and is never the less cleaned out in the subsequent level two patterning (e.g., operation 140 of FIG. 1).

In another embodiment a sacrificial enabling pattern is synthesized to nest a target polygon with one or more enabling polygons having an edge positioned adjacent to the longest edge of the target polygon. As an example, in FIG. 3B a target polygon 330 is nested with the enabling polygon 331 having an edge adjacent to the longest edge of the target polygon 330. Such nesting may allow the target polygon 330 to print with the reduced minimum dimension, $CD_1$, because the synthesized grating pattern 321 is extended past the target polygon 330. In another embodiment, an enabling polygon joins less than all of a longest length of a first target polygon to a second target polygon to provide a continuous edge that is proximate to a longest edge of a third target polygon. For example, in FIG. 3B, a portion of the longest edge of the target polygon 332 is joined to a portion of the longest edge of the target polygon 333 by the enabling polygon 334. The shortest edges of the target polygons 332, 333 combine with an edge of the enabling polygon 334 to form a continuous edge of the synthesized grating pattern 321. This continuous edge, in turn, benefits the imaging of the adjacent target polygon 330, which is particularly advantageous where the target polygon 330 is a narrow feature having a shortest edge drawn to a minimum dimension design rule for the target pattern (e.g., $CD_1$).

Returning to FIG. 2, with the grating pattern 221 synthesized, the method 200 proceeds to correct the drawn grating at the OPC operation 225. The OPC performed is to compute and adjust extension of edges of the opaque/non-transparent (e.g., chrome), very low transmittance (e.g., 6% in embedded phase shift masks), etc. areas of a mask that will be used to print the synthesized grating pattern 221. The OPC treatment at operation 225 may include the addition of assist features 227 (i.e., scatter bars), serif structures, and the like to the synthesized grating pattern 221 to generate a corrected grating pattern 226.

Figure 3C:
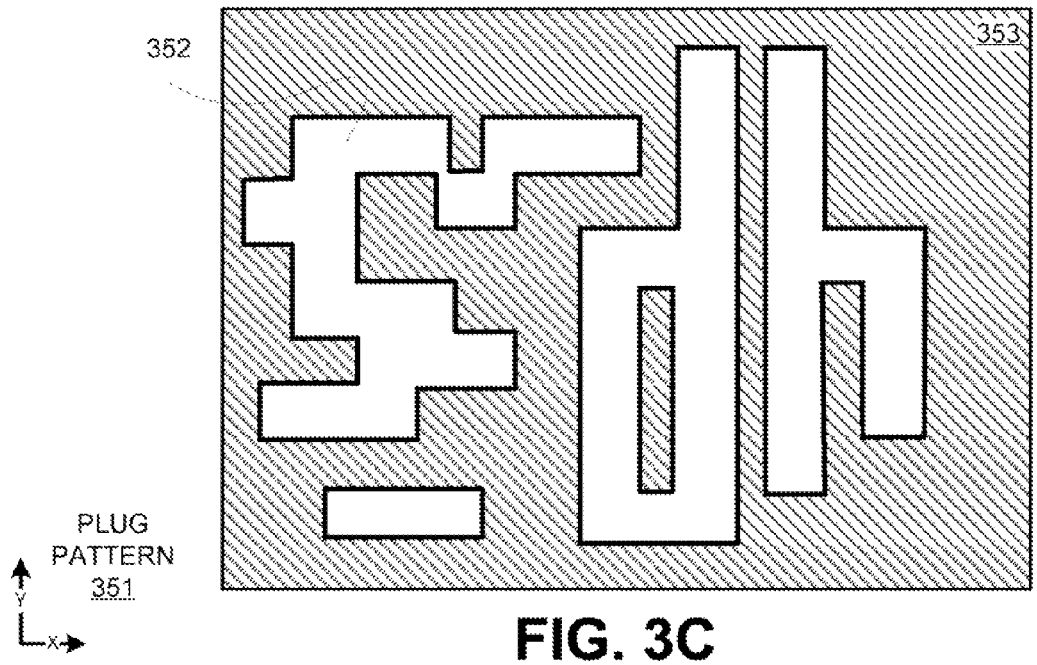

At operation 230, a synthesized second level (plug) pattern 231 is generated from the synthesized enabling pattern 216. As with the synthesized enabling pattern 216, the plug pattern 231 does not form a part of the electrically active set of polygons and so polygons comprising the plug pattern 231 are therefore also referred to herein as "synthesized." In one embodiment, as illustrated in FIG. 2, the plug pattern is synthesized at operation 230 to fully cover the sacrificial enabling polygons while maintaining a mask error enhancement factor (MEEF) below that of the target pattern. In a further embodiment, the polygons of the synthesized enabling pattern 216 are synthesized to overlap the drawn sacrificial enabling polygons. FIG. 3C further depicts an exemplary plug pattern 351 generated to remove the sacrificial enabling patterns 316 from the synthesized grating pattern 321. In one particular embodiment, the polygons 352 form high transmittance regions in a mask with the surrounding regions 353 being opaque. One of skill in the art will appreciate however, that the methods described herein may be adapted to utilize a plug pattern 351 having an opposite polarity as that depicted in the exemplary embodiment depicted in FIG. 3C.

Figure 3D:
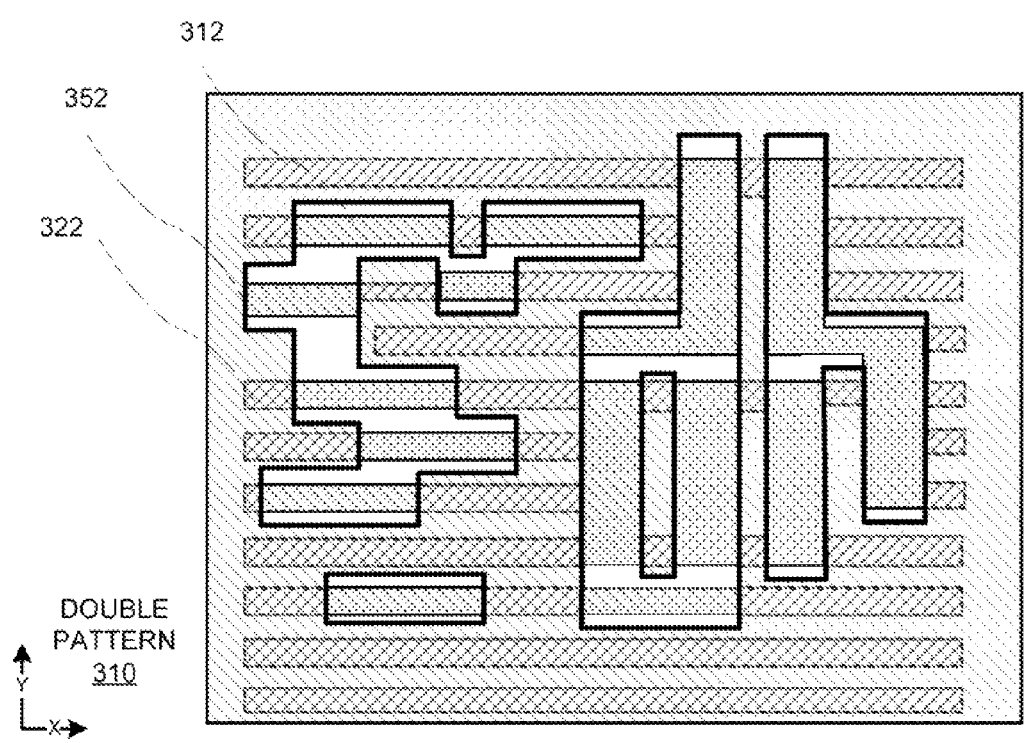
FIG. 3D illustrates a layout view of set of masks depicted in FIGS. 3B-3C and showing a composite of the target pattern depicted in FIG. 3A, in accordance with an embodiment.

FIG. 3D depicts the plug pattern 351 overlayed on the synthesized grating pattern 321 to illustrate how the two mask levels are to compose the target pattern 311. In one particular embodiment where the enclosed polygons 312 are to form open regions in the first level mask corresponding to the target pattern, the enclosed polygons 322 are to form open regions in the first level mask corresponding to the sacrificial enabling structures, and the enclosed polygons 352 are to form closed regions in the second level mask, the double pattern 310 results in a trench in photoresist rendering the target pattern. Such an embodiment is advantageous for a metal interconnect level, for example.

As shown in FIG. 3D, the plug pattern 351 essentially fully covers the sacrificial enabling pattern 316 without covering any substantial portion of the target pattern 311. The plug pattern 351, although not complex, removes the sacrificial enabling pattern 316 without generating a plug polygon that touches a longest edge of a target polygon having a shortest edge drawn to a minimum dimension design rule ($CD_1$) for the target pattern 311. Notably, the plug pattern 351 need only touch longest edges of target polygons oriented along the y-axis. Scumming concerns may be reduced with polygons oriented along the y-axis being less narrow than those oriented along the x-axis of the grating.

At operation 240, an OPC process is performed on the drawn plug pattern. Because the double patterning mask design has stringent overlay requirements, in one embodiment, the OPC process performed at operation 240 is based on a predicted grating pattern contour 251. The contour 251 may be generated by a Constant Threshold Model, or a Variable Threshold Resist (VTR) model. For such embodiments, the OPC performed on the second level pattern is dependent on the OPC performed on the first level patterning. Generally, the OPC performed at operation 240 takes, as an input, the output of the first level (grating pattern) OPC and generates the predicted grating pattern contour 251.

At operation 250, the expected or predicted grating pattern contour 251 is generated from the corrected grating pattern 221. In a particular embodiment, the grating pattern contour 251 is a model prediction of the grating pattern's imaging performance. The model prediction may be based on one or more statistical and phenomenological models characterizing a lithographic process that is to be used to print the grating pattern (e.g., at operation 115 of FIG. 1), such as, but not limited to, diffractive, diffusive and fluidic mechanics.

Figures 4A, 4B, 4C:
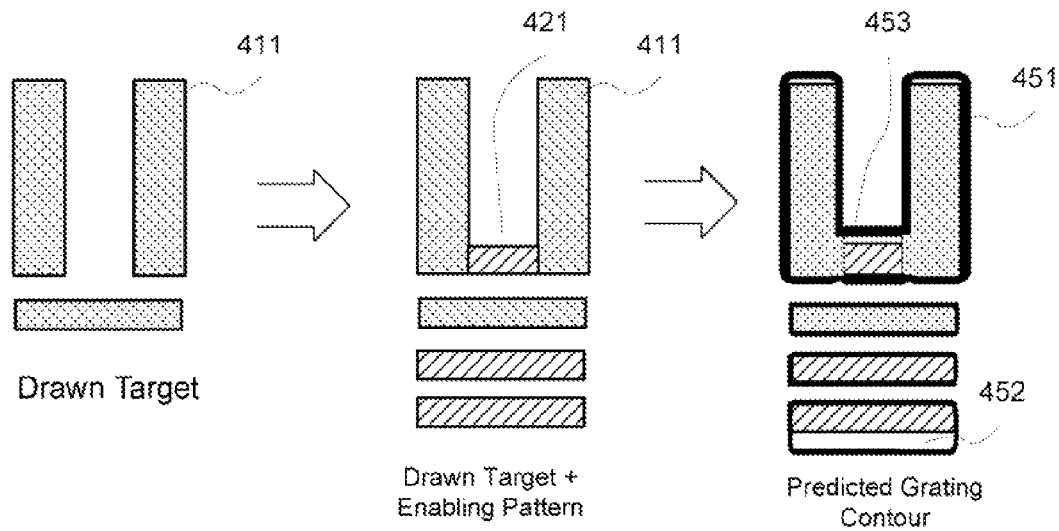
FIGS. 4A, 4B and 4D illustrate layout views of portions of the patterns depicted in FIGS. 3A, 3B and 3D, respectively, in accordance with an embodiment.
FIGS. 4C and 4E illustrate intensity contours of a first and second level pattern, as corrected from their drawn state, in accordance with an embodiment.

In the exemplary embodiment depicted in FIG. 2, the model predicted grating pattern contour 251 is utilized in the correction of the second level pattern (e.g., "plug" pattern) to bound a sizing of the plug pattern at operation 260. It should be noted the exemplary plug OPC embodiments herein avoid a rule-based approach to pre-compensating the plug pattern for potential grating upsizing or grating pattern contour shifts because such rule-based approaches may require significantly more die-area. FIG. 4A illustrates a layout view of a portion 411 of the target pattern 311 depicted in FIG. 3A with a corresponding portion 421 of the synthesized grating pattern 321 is further shown in FIG. 4B. FIG. 4C illustrates a predicted grating contour 451 for the grating pattern portion 421. The grating contour may deviate substantially from the synthesized grating pattern, as shown with contour regions 452 and 453 for example.

Figures 4D, 4E:
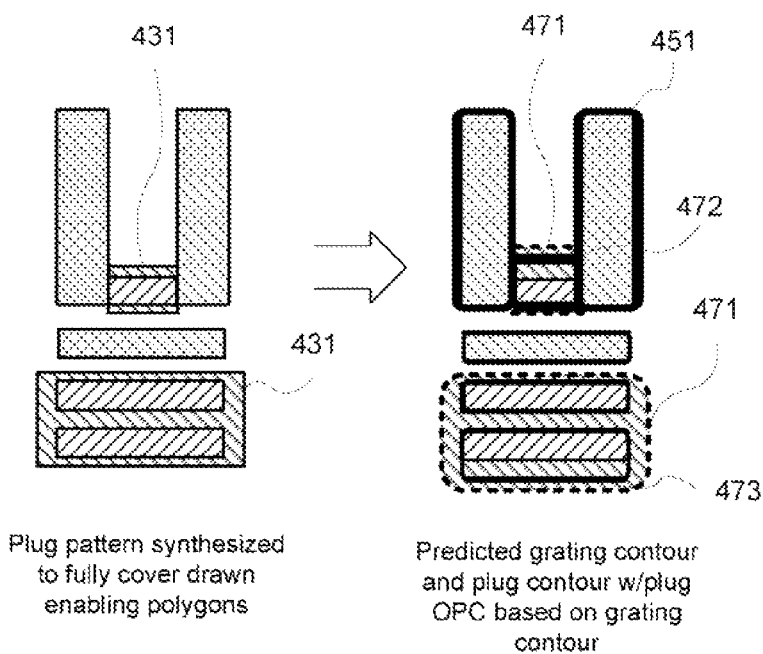

FIG. 4D illustrates a plug pattern 431 synthesized to fully cover the sacrificial enabling polygons (as synthesized). FIG. 4E illustrates a predicted plug contour 471 generated in accordance with an embodiment of the present invention which corrects the plug pattern 431 based on the predicted grating pattern contour 451. As such, the plug OPC process is made aware of where the grating does not converge exactly to the synthesized grating target so that the plug grows out to meet a specification for coverage or overlap of the sacrificial enabling structures. Following this paradigm, the second level OPC described herein avoids forming a bridge 472 between two adjacent target structures or an artifact 473 of the sacrificial enabling pattern that may have formed had the plug pattern 431 not been corrected in a manner "aware" of the predicted grating contour 451.

Figure 5:
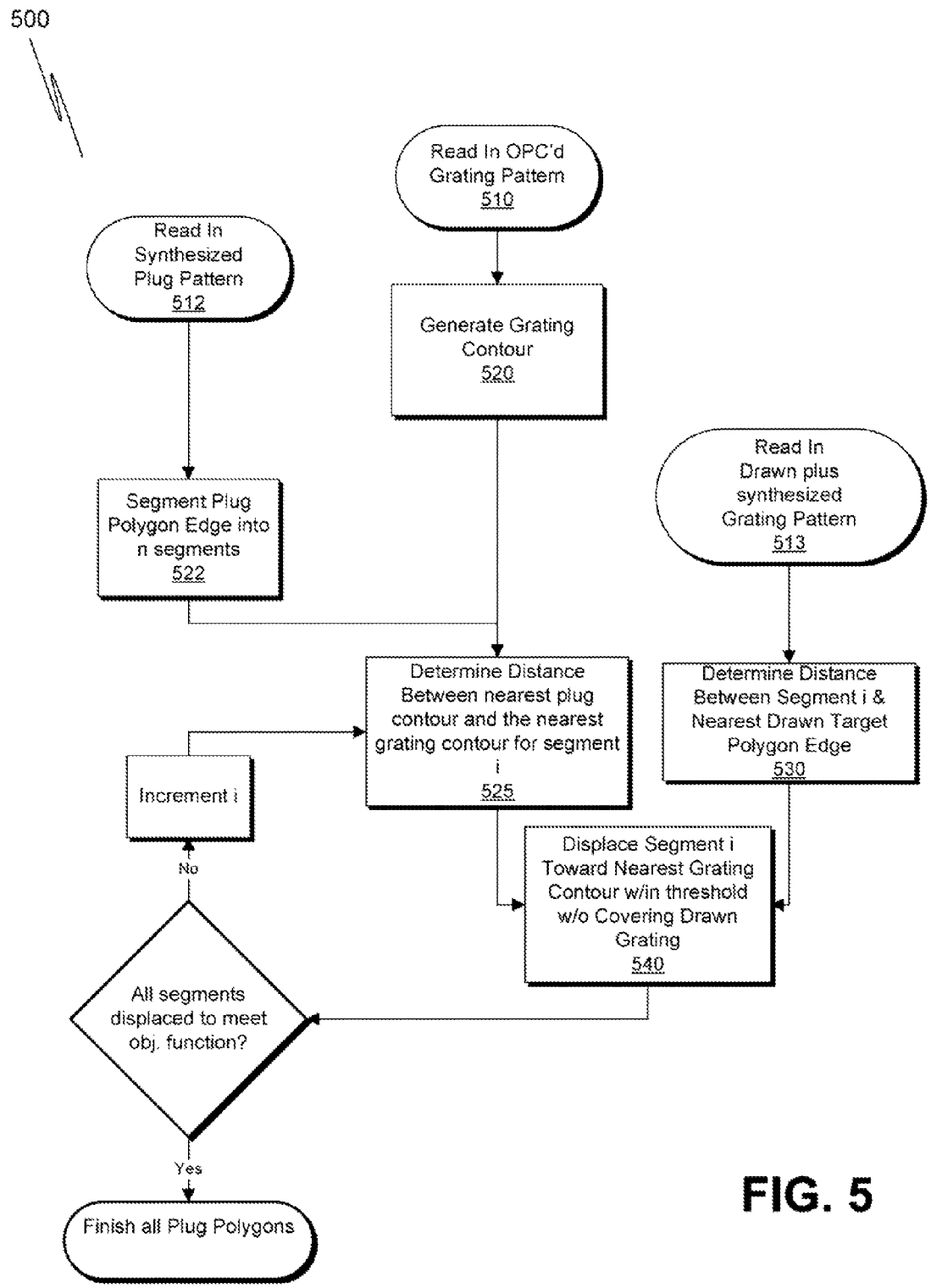
FIG. 5 illustrates a flow diagram depicting selected operations in an optical proximity correction process for a second mask of the set of masks to successively imaged during a double patterning lithographically process, in accordance with an embodiment.

FIG. 5 illustrates a flow diagram depicting selected operations in the OPC process 500 performed at operation 240, in accordance with an embodiment. Generally, the OPC process 500 is to determine a distance between the plug contour and grating contour, and then assign a corresponding displacement to the synthesized plug pattern to ensure the plug contour encloses the sacrificial grating contour. As shown, the second-level OPC process begins at operation 510 by reading in the OPC output for the grating pattern (first level pattern). The grating contour is then generated at operation 520. At operation 512, the synthesized plug pattern (second level pattern) is read in. In the exemplary embodiment, polygons of the synthesized plug pattern are segmented at operation 522.

Figure 6:
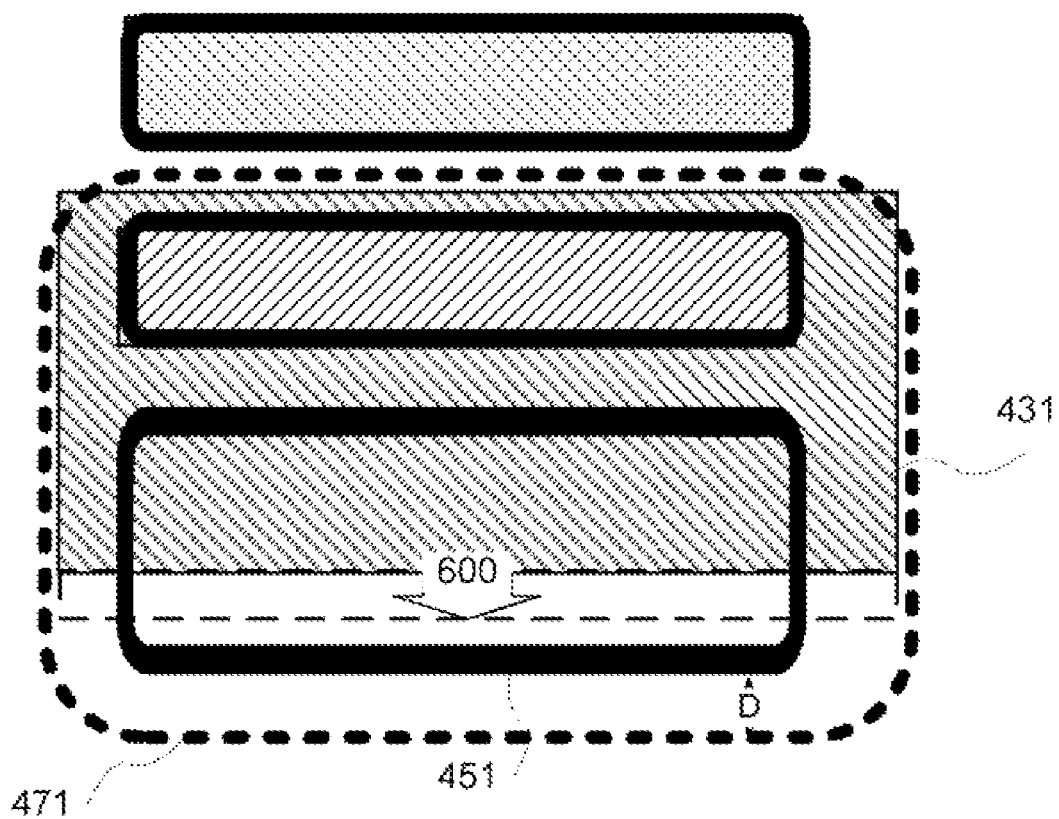
FIG. 6 illustrates a layout view of a portion of a first level intensity contour being utilized for OPC of a second level polygon, in accordance with an embodiment.

For example, each polygon may be segmented into n segments where the number n may depend on the complexity of the plug polygon. Beginning with a first segment of a first plug polygon, a distance between the nearest plug contour and the nearest grating contour is determined. In the exemplary embodiment shown in FIG. 6, an outside distance $D_{out}$, as measured externally from the drawn plug edge to the nearest the grating contour 451, is determined. In a further embodiment, an inside distance $D_{in}$, as measured internally from the drawn plug edge to the nearest the grating contour 451, is also determined for each segment. The inside and outside distances are then used to bound and drive a displacement of the plug segment from its drawn position.

Returning to FIG. 5, at operation 513, the drawn target pattern and synthesized grating pattern is read in. At operation 530, an outside distance between the plug segment and the nearest drawn target polygon edge is determined so that the plug segment is not displaced over a target polygon in the effort to expand the plug polygon edges to meet a nearest grating contour 451. At operation 540, the plug polygon segment is displaced toward the nearest grating contour without covering a drawn target pattern, based on the distances determined at operations 525 and 530 which define a relationship (inside/outside/collinear) between the drawn plug segment and both the drawn target and the grating contour.

One or more objective functions may be applied at operation 540. For example, a segment may be displaced to maintain a minimum distance between the segment and a target pattern polygon edge. In an alternative embodiment, a plug segment is displaced to be outside of the sacrificial enabling pattern if the determined distances indicate the nearest grating contour is outside of the sacrificial enabling pattern and the target pattern by more than a threshold tolerance. Such a threshold tolerance may be based on an empirically determined lithographic process tolerance. Segment displacement proceeds iteratively until all segments of a plug polygon have meet the objective function and the OPC method 500 completes when a similar sizing algorithm has been executed for all plug polygons.

In a further embodiment, the second level OPC is based on a model predicted pattern contour which is derived from a second level resist profile model as a function of underlying topography (e.g., topography resulting from the first level pattern). A resist profile is an output of a simulation of the chemically altered portion of the resist layer corresponding to the spatial distribution of a radiation intensity through the thickness of the resist layer as would be formed by a patterned mask. Because the second level photoresist is applied over the first level pattern, topographical effects are much more significant than for the first level photoresist which is applied to a more ideally planar substrate surface as typically encountered in contemporary photolithography.

The modeled resist profile embodiments described herein are three to four orders of magnitude faster than a rigorous computation of the radiation intensity which may be performed with a 3D field solver using a finite-difference time-domain (FTD) method combined with a photoresist chemistry solver. As such the modeled resist profile embodiments described herein are full-chip capable. Rigorous methods are prohibitively slow for chip-scale OPC due to the enormous number of image calculations that OPC algorithms must carry out. For OPC, multiple intensity calculations are made to characterize the image rendering any given one of the hundreds of millions of features in a mask level, and pattern adjustments are also typically iterated to accommodate the interaction of each adjusted feature with its neighbors.

In addition to the modeled resist profile embodiments described herein being very fast, because they are physics-based rather than rule-based they may be applied to arbitrary polygon shapes and arbitrary topographies. In contrast, rule-based models or models which adopt empirically derived topography rules that don't otherwise account for topography are inherently limited to a finite set of tabulated correction factors. Furthermore, because bulk intensity and photoresist development models contain many fitting parameters, which do not correspond to measurable physical phenomena relating to topography, they are difficult to adjust to accommodate topographic effects.

While the photoresist profile model is described herein for the specific application of multi-level patterning process such as illustrated in FIG. 1, it should be appreciated that the methodology is readily applicable to modeling of any resist profile where the substrate is inhomogeneous. For example, the above two component model is suitable for conditions where no topographic feature is present under a photoresist to be modeled, but there is a variation in the composition of the underlying materials across a given area of photoresist which present a different index contrast that may impact the resist profile. As another example, underlying topography may impact the resist profile even where a single layer of photoresist is applied because the substrate may not be completely planar (e.g., after short recess etches, cleans, etc.). In this situation too, the photoresist profile model described herein advantageously improves an OPC calculation that assumes planarity or is limited to an application of an empirically-based topographic rule set. As such, the resist profiling embodiments described herein are not limited to multiple-patterning processes.

Generally, the topography dependent resist profile model employs a two-step approach. First, a base intensity is computed as a function of both a first intensity modeled for a first homogenous substrate and a second intensity modeled for a second homogenous substrate. Second, the base intensity is corrected for edge effects on each of scattering and diffusion. As such, the resist profile is model predicted in a manner which accounts for topography based on two distinct spaces. The first space, optical scattering, is affected by index contrast at the interface between the photoresist and the topographic material (e.g., first level photoresist feature). The second space, chemical diffusion, is affected by the physical barriers presented by the surface of the topographic material (e.g., first level photoresist feature).

Both optical scattering and diffusion effects are modeled as edge-driven perturbations from the nominal bulk value which are correlated to the known location of the underlying topographic edges. In the exemplary double-patterning embodiment, these underlying topographic edges are known from a model of the first level pattern contour and may be input in to the second level OPC algorithm to model the second level photoresist profile. In alternative embodiments, because substrate inhomogeneity is usually a direct result of a previously lithographic operation, the relevant prior layer pattern contour may be used to identify the edge locations for determining the subsequent photoresist profile.

It has been found that separating the model into a diffusion and scattering correction function is accurate, as compared to a rigorous, method and yet fast enough for full-chip OPC applications. Furthermore, bifurcating the profile computation into the above two steps enables the model to be generated very quickly because only the first step need be calculated for evaluation points sufficiently far from an edge of a topographic feature. Also, in treating each of these effects separately, physically meaningful fitting parameters may be included in each correction function to tune a resist profile model to the particular lithographic process employed in wafer manufacture.

Figure 7A:
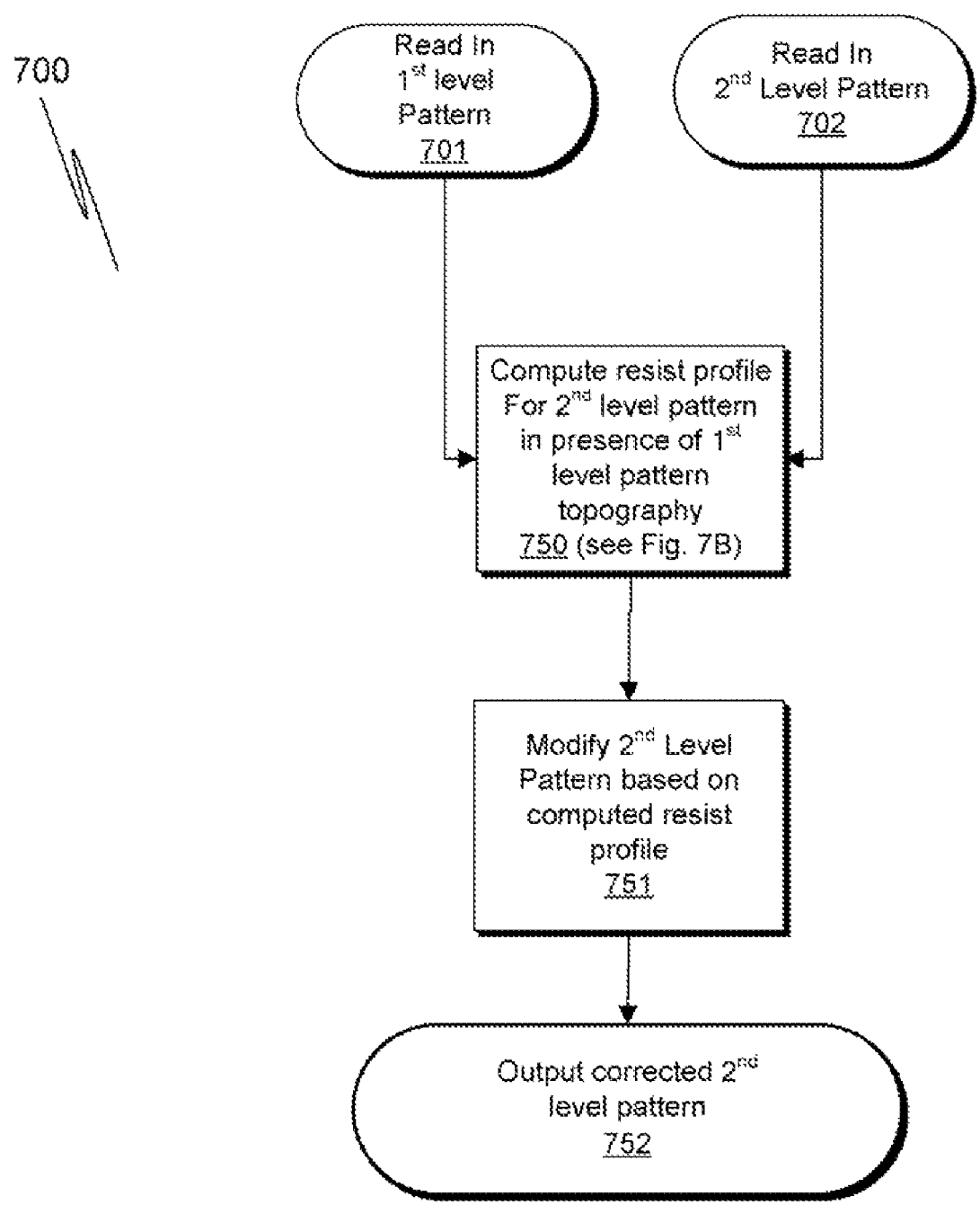
FIG. 7A is a flow diagram of an OPC algorithm which makes corrections to a second level pattern based on a second level resist profile model as a function of first level pattern topography, in accordance with an embodiment.

FIG. 7A illustrates a flow diagram of an exemplary method 700 for modeling a resist profile in the presence of topography. The method 700 begins at operation 701 with reading in the first level pattern from which edge locations may be determined using any technique known in the art for such purposes. In one embodiment, the model-predicted grating pattern contour 251 (FIG. 2) is read in at operation 701. At operation 702, the uncorrected second level pattern is read in at a first iteration of operation 701 or a second level pattern as corrected by a previous iteration of method 700 is read in for a subsequent iteration. At operation 750, the resist profile for the second level pattern (e.g., plug pattern 231 of FIG. 2) is computed based on the first level pattern.

Figure 7B:
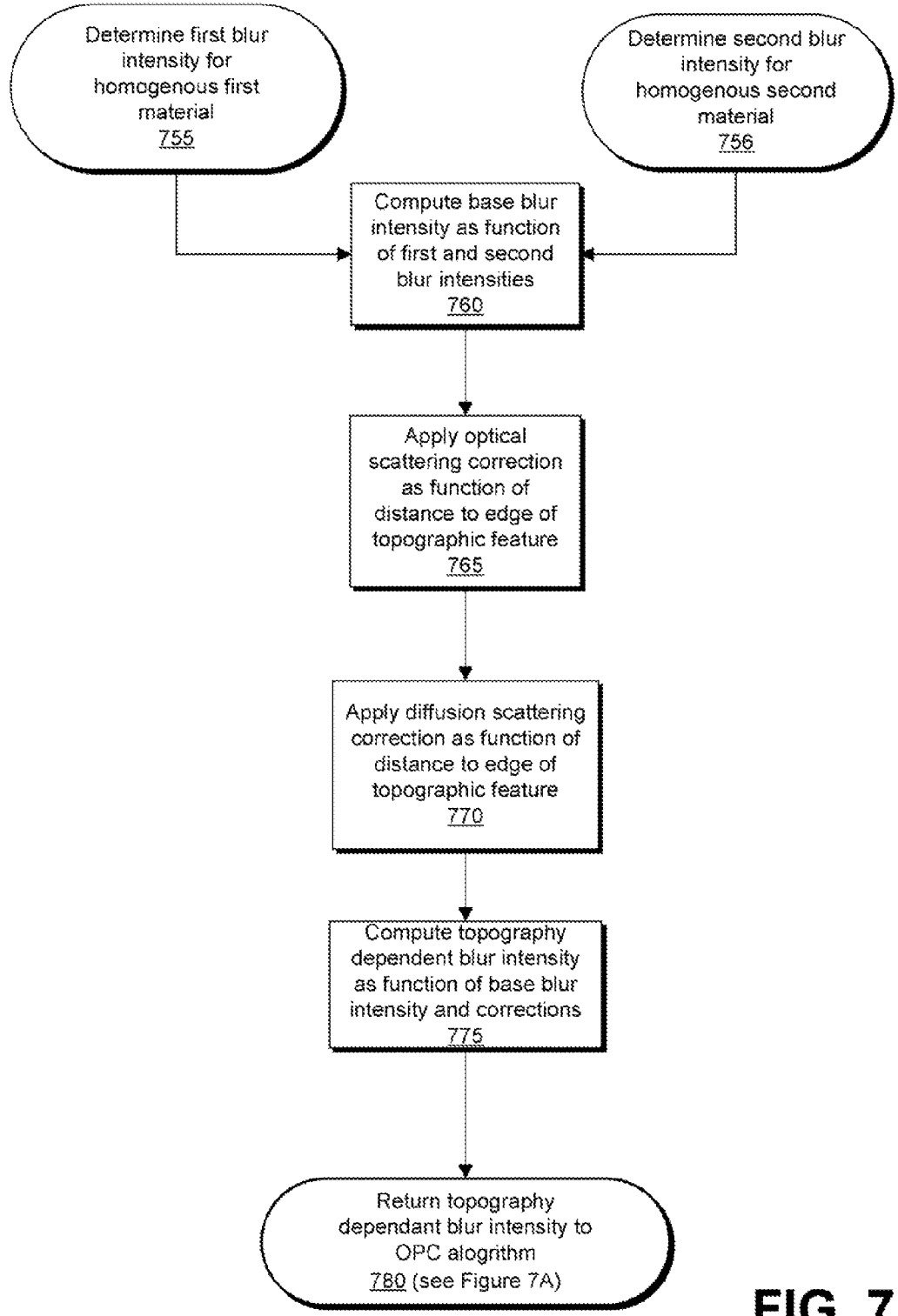
FIG. 7B is a flow diagram for modeling a resist profile for an inhomogeneous substrate, in accordance with an embodiment.

Operation 750 is expanded in FIG. 7B. Referring to FIG. 7B, at operations 755 and 756, a first and second blur intensity is computed. Each of the first and second blur intensities may be computed at each evaluation point using conventional techniques known in the art for a homogeneous substrate. In one embodiment, a commercially available resist profile modeling package is utilized to first generate the first blur intensity and then generate the second blur intensity.

The first blur intensity is computed from a model that assumes the substrate is a planar homogeneous film of a first type (e.g., the first level grating pattern photo resist). The second blur intensity is then computed from a model that assumes the substrate is a planar homogeneous film of a second type which is present where the underlying topographic feature is absent (e.g., the substrate material where upon which the grating pattern is disposed). At operation 760 a base intensity as a function of each of the first and second blur intensities is computed. The "mixture" of blur intensities calculated at operation 760 represents a nominal intensity for the inhomogeneous substrate present at the second patterning level where each of the first and second substrate materials are disposed below different areas of the first photoresist layer. In one embodiment, the base intensity is a sum of the first and second intensities scaled based on the topographic pattern. In the exemplary embodiment:

$$I_{base}(x) = I_1(x)C_1(x) + I_2(x)(1-C_1(x)), \quad (1)$$

where $I_{base}$ is the base intensity computed as a function of the first blur intensity ($I_1$) obtained based on top of the first substrate (grating level), the second blur intensity ($I_2$) obtained based on the second substrate (with no grating present) and the convolution ($C_1$) of the topography layer (e.g., grating represented by one or more rectangular functions) and the Gaussian function.

With the base intensity computed, the method 700 proceeds to operation 765 to apply an optical scattering correction function, $F_{scat}$ to the base intensity. In the exemplary embodiment, operation 765 determines a multiple of the base intensity and the optical scattering correction function at the evaluation point:

$$I_{base}(|F_{scat}(d)|) \quad (2)$$

The optical scattering correction is a function of a distance, d, between the evaluation point and the topographic edge for which the scattering is attributed ($F_{scat}(d)$) and generally represents a perturbation of the base intensity induced by the index contrast of the topographic edge at the evaluation point. The optical scattering correction function may take any number of forms, depending on the fitting parameters utilized. In an exemplary embodiment, the optical scattering correction function is an exponential function. However, one of skill in the art may determine other suitable functions (square, polynomial, etc.) by fitting rigorous field computation results to various functions scaling the base intensity.

In the exemplary embodiment, at operation 770, a diffusion scattering correction function, $F_{diff}$ is applied to the base intensity. Like the optical scattering correction function, the diffusion correction function may take any number of forms, depending on the fitting parameters utilized. In an exemplary embodiment, the diffusion scattering correction function is a sinusoidal function. However, one of skill in the art may determine other suitable functions (exponential, polynomial, etc.) by quantifying a photoresist chemistry solver's modification of an output from rigorous field computation output and fitting that quantification to various functions scaling the base intensity.

In the exemplary embodiment, the diffusion correction factor is applied to the base intensity in dimensional components to arrive the diffusion perturbation resulting from an edge. Generally, to model how an exposure chemistry gradient would deviant from the nominal case (no topography) one needs to know where a gradient of the second level exposure chemistry coincides with an edge of a topographic feature. At that location, the nominal diffusion function is hindered by the presence of the edge surface/interface. In one embodiment therefore, a first diffusion perturbation component is determined at operation 770 based on the diffusion correction function, a slope of the base intensity in a first dimension, and a slope of the topographic edge in the x-dimension:

$$\frac{G_x}{\sqrt{G_x^2 + G_y^2}} F_{diff}(d) \frac{d I_{base}}{dx}, \quad (3)$$

and in the y-dimension:

$$\frac{G_y}{\sqrt{G_x^2 + G_y^2}} F_{diff}(d) \frac{d I_{base}}{dy}, \quad (4)$$

where $G_x$ is the topography x slope and $G_y$ is the topography y slope. In further embodiments, a z-dimension (thickness) diffusion perturbation component may also be determined at operation 770.

At operation 775, the optical scattering (Eq. (2)) and diffusion perturbations (Eq. (2) and (3)) are summed with the base intensity (Eq. (1)) to compute the topography dependent blur intensity:

$$I = I_{base} + I_{base}(|F_{scat}(d)|) + \quad (5)$$
$$\frac{G_x}{\sqrt{G_x^2 + G_y^2}} F_{diff}(d) \frac{d I_{base}}{dx} + \frac{G_y}{\sqrt{G_x^2 + G_y^2}} F_{diff}(d) \frac{d I_{base}}{dy}$$

This topography dependent blur intensity may then be input, at operation 780, into the optical proximity correction algorithm as would a non-topography dependent blur intensity (e.g., $I_1$). Returning to FIG. 7A, at operation 751, a correction to a dimension of a polygon in the second level pattern is adjusted based on the second level resist profile computed in the presence of the first level topography. The OPC method 700 then ends at operation 752 with an output of the corrected second level pattern. As will be appreciated by one familiar with the art, the method 700 may be iterated a number of times for each of a plurality of polygon segments for each of the polygons in the second level mask to arrive at a full-chip OPC second level pattern.

Figure 7C:
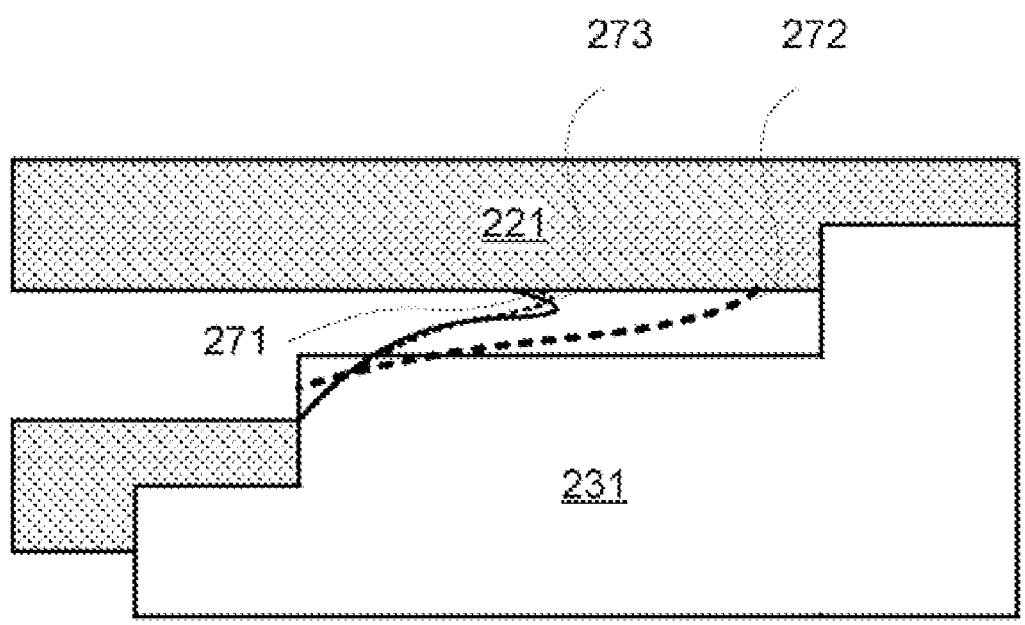
FIG. 7C illustrates a layout view of a second level mask pattern contour modeled based on a first level pattern and a second level pattern

An example of an output from the OPC method 700 is illustrated in FIG. 7C. The second patterning level contour 271 (solid line) is generated based on an embodiment of the topography dependent resist profile model described herein. As shown, the topography from grating pattern 221 results in a significant resist break at the second level (as compared to the uncorrected synthesized plug pattern 231). The dashed line 272 represents a second patterning level contour output by a conventional resist profile simulator which does not model topography (rule-based). As shown, the dashed line 272 does not display any substantial resist breaking. A second patterning level contour 273 (dotted line) as generated by a rigorous 3D simulation is also depicted in FIG. 7C. The improved performance of the topography dependent resist profile model algorithms described herein are evident by the better fit of the patterning level contour 271 to the rigorous contour 273. Returning to FIG. 2, at operation 270, a plug contour, such as that depicted in FIG. 7C, may then be generated for the corrected plug pattern 261 for points where the modeled resist profile crosses a threshold.

In one embodiment of the present invention, the verification algorithm employed at operation 280 is configured for a multiple patterning process which captures the interpolate of the first and second masks (e.g., grating and plug masks). Proper verification of layers in double patterning processes rely on a computation of a resist profile that results from a composite effect of two masks. For example, for the grating and plug mask patterns described herein, the composite effect of the first and second mask levels is a subtraction of the plug level from the grating level. At verification therefore, a subtraction of the modeled contour of the plug mask from the modeled contour of the grating mask should arrive at the target pattern, and if not, indicate a violation. In an alternative pitch doubling embodiment where a final mask is a sum of two masks, a final contour is a sum of two contours, a Boolean OR operation with the contours of each mask. In still another embodiment, the Boolean of two contours is employed in an algorithm to verify differences between two models which may be due to two different processes. The difference function contour can provide information for how different the two contours or processes are at different patterning regions. Although software packages exist which are capable of performing geometric Booleans of arbitrary shaped contours, such a computation is a relatively slow process. For the purposes of mask OPC and verification of a double patterning mask set, performing a Boolean of the billions of polygons present in the mask patterns is prohibitive.

Figure 8A:
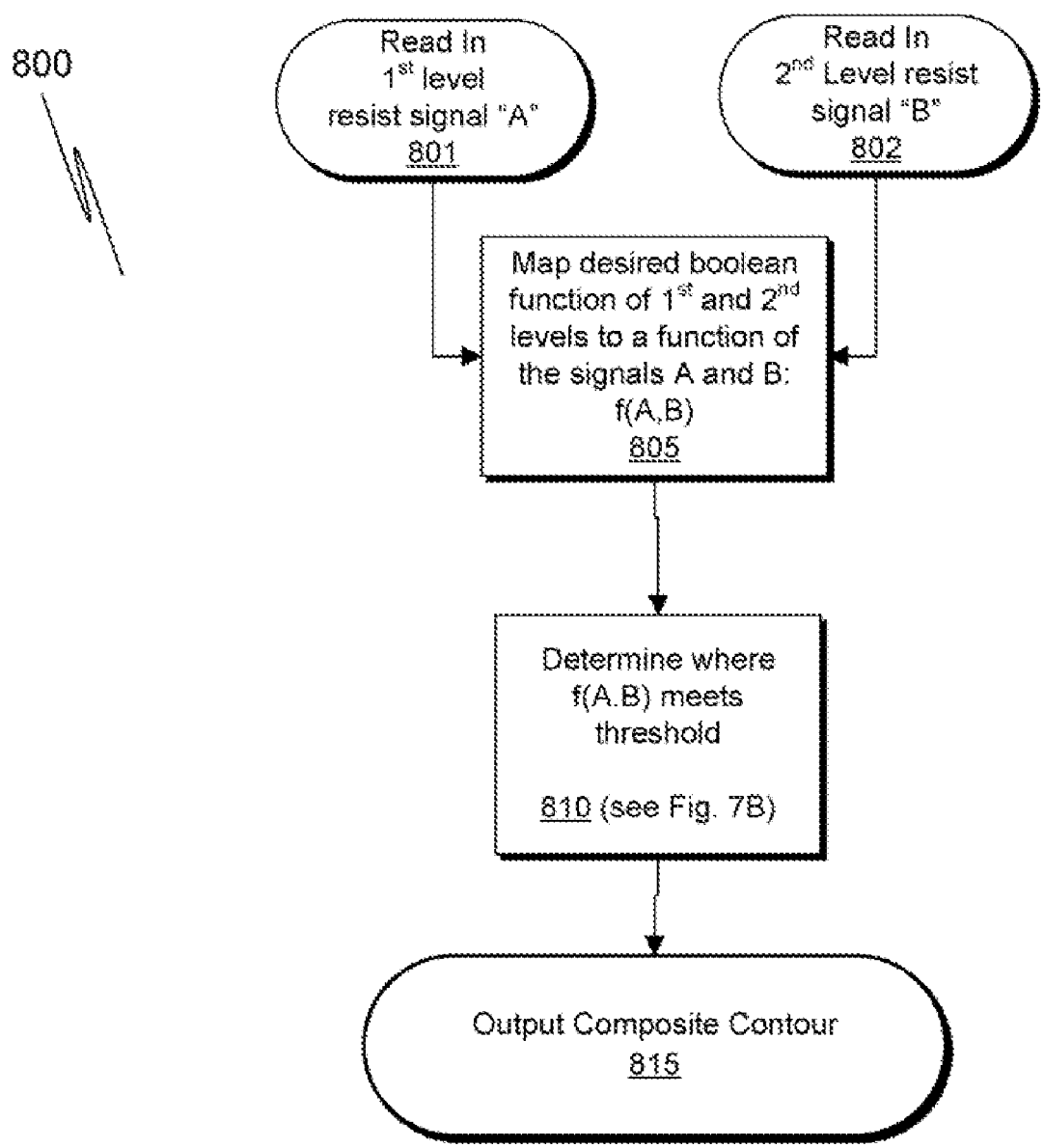
FIG. 8A illustrates a flow diagram for predicting a Boolean operation of polygons modeled for a photolithographic mask set, in accordance with an embodiment.

In an embodiment of the present invention, the verification algorithm employed at operation 280 generates a composite contour 281 based on a function of the resist signals from each of at least two mask patterns. FIG. 8A illustrates an exemplary fast method 800 for performing a Boolean operation of arbitrarily shaped contour. Method 800 begins with reading in a first resist signal ("A") for the first mask level of a double patterning process at operation 801 and reading in a second resist signal ("B") for the second mask level of the double patterning process at operation 802. The image intensity signal may be generated using a conventional grid-based aerial image model that calculates an expected image intensity I(x, y) at a regular series of fixed grid points.

At operation 805 a Boolean function of the first and second level resist patterns is mapped to a function, $f(A,B)$ of the first and second resist signals. The functional form of $f(A,B)$ is based on the Boolean operation being performed by the double patterning and the polarity of the mask patterns. For example, in the grating and plug double patterning embodiment described elsewhere herein, the second level plug mask is a deduction from the first level grating mask. Because the polarity of the masks for the exemplary grating and plug embodiment are the same, the mask level relationship is:

Grating Contour−Plug Contour (6)

so that $f(A,B)$ takes the form (A−B). For other mask polarities, the signage of the signals A and B may change so that the $f(A,B)$ takes the form (A+B), (B−A), etc.

At operation 810, $f(A,B)$ is mapped to the functions which are evaluated by the resist simulator for computing a pattern contour. The functions to which $f(A,B)$ is mapped is dependent on the type of model being used to generate the contour. As one example, where a VTR model is employed with a grid of evaluation points positioned across the mask area, local image intensities, various derivatives of the image intensity, and the variable resist threshold with which the resist material will be cleared are functions to which $f(A,B)$ may be mapped. While any method of generating a contour from such image data may be used, in an exemplary embodiment a marching square algorithm is used to detect threshold crossings. The marching square algorithm performs it's searching function as known in the art, and evaluates $f(A,B)$ to output a zero crossing which corresponds to the Boolean operation mapped to the resist modeling functions.

Figure 8B:
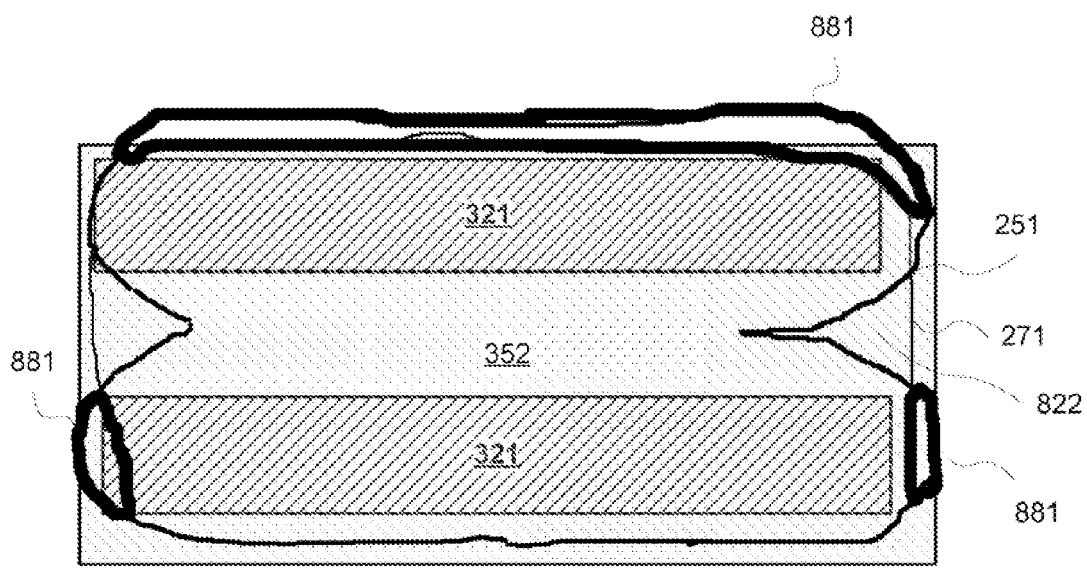
FIGS. 8B and 8C illustrate a composite contour resulting from a Boolean operation of polygons modeled for a photolithographic mask set, in accordance with an embodiment.

At operation 815, the composite contour is output by the resist simulator as a result of mapping the Boolean function to the functions from which the pattern contour is generated through thresholding. As such, the method 800 modifies the modeling functions at the resist signal level to generate a Boolean contour of the signals, which can be performed much more quickly than can a geometric Boolean of two arbitrary shaped contours. FIG. 8B illustrates an exemplary output in which $f(A,B)$ takes the form (A−B) and a difference contour 881 is generated. The first level contour 251 (A signal or grating contour), the second level contour 271 (B signal or plug contour), and the patterns 321, 351 from which the resist models were generated are also depicted. As shown in FIG. 8B, the difference contour 881 produced by the marching square algorithm corresponds to regions where the first level contour 251 extends beyond the second level contour 271. The region 822, where the second level contour 251 extends beyond the first level contour 271 is thresholded out (e.g., A-B is below the zero crossing).

Figure 8C:
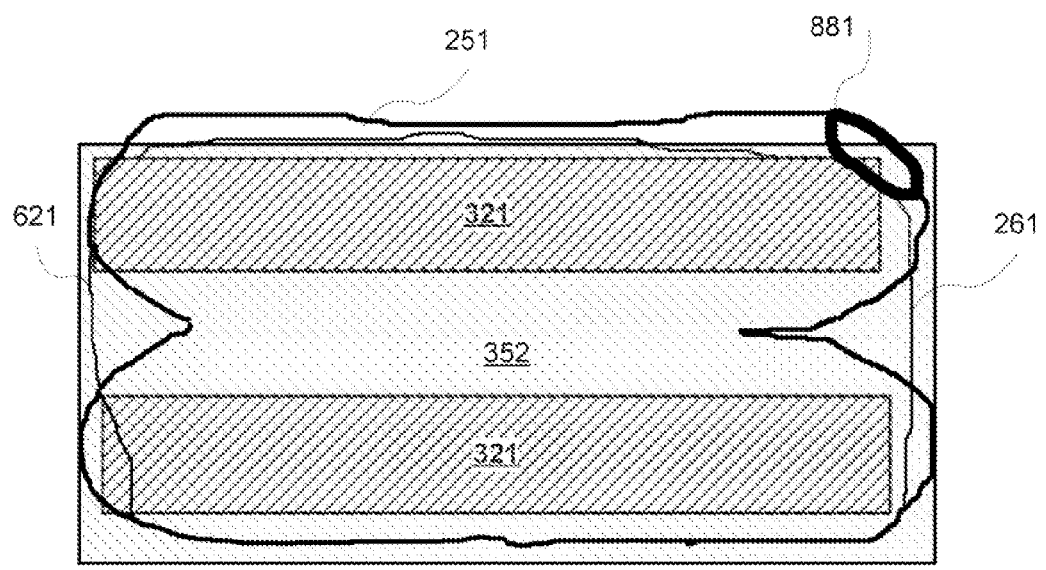
Figure 8D:
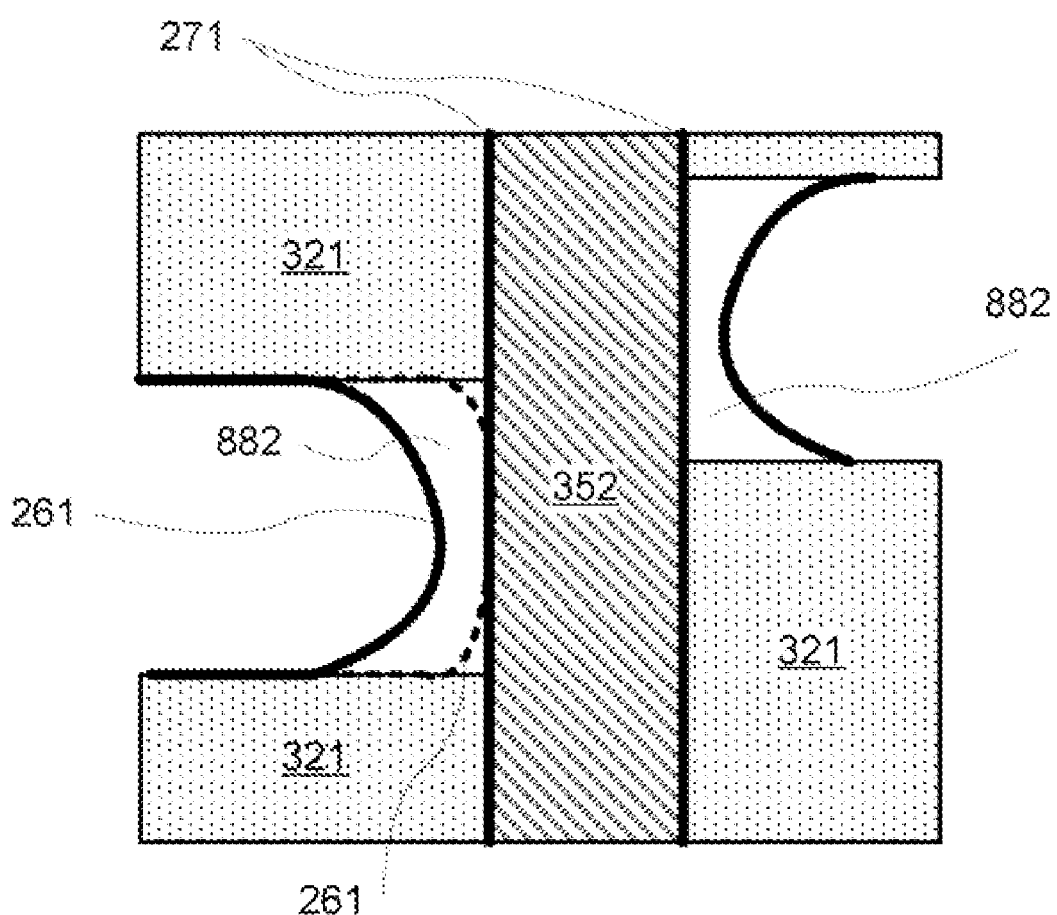
FIG. 8D illustrates a layout view of a first level mask pattern contour and second level mask pattern contour and a pinch violation.

FIG. 8D illustrates an example of a topographic effect which may not be accurately captured by a verification process absent the embodiments described herein which are designed for multi-level composite patterns. In the layout view shown, the first level contour 251 predicts the imaging performance of the synthesized grating pattern 321 while the second level contour 271 predicts the imaging performance of the plug pattern 352. As shown, upon arriving at the composite effect of the two mask levels (either by the method 800 or by a conventional geometric Boolean operation of the pattern contours), the sliver 882 would result in a pinch error violation because portions of the synthesized grating pattern 321 are bridged. However, if contour 271 should snap toward the second level pattern 352 because of effects of the double-patterning process, a verification algorithm which merely operates on pattern contours generated as independent layers will result in numerous false violations.

Figure 8E:
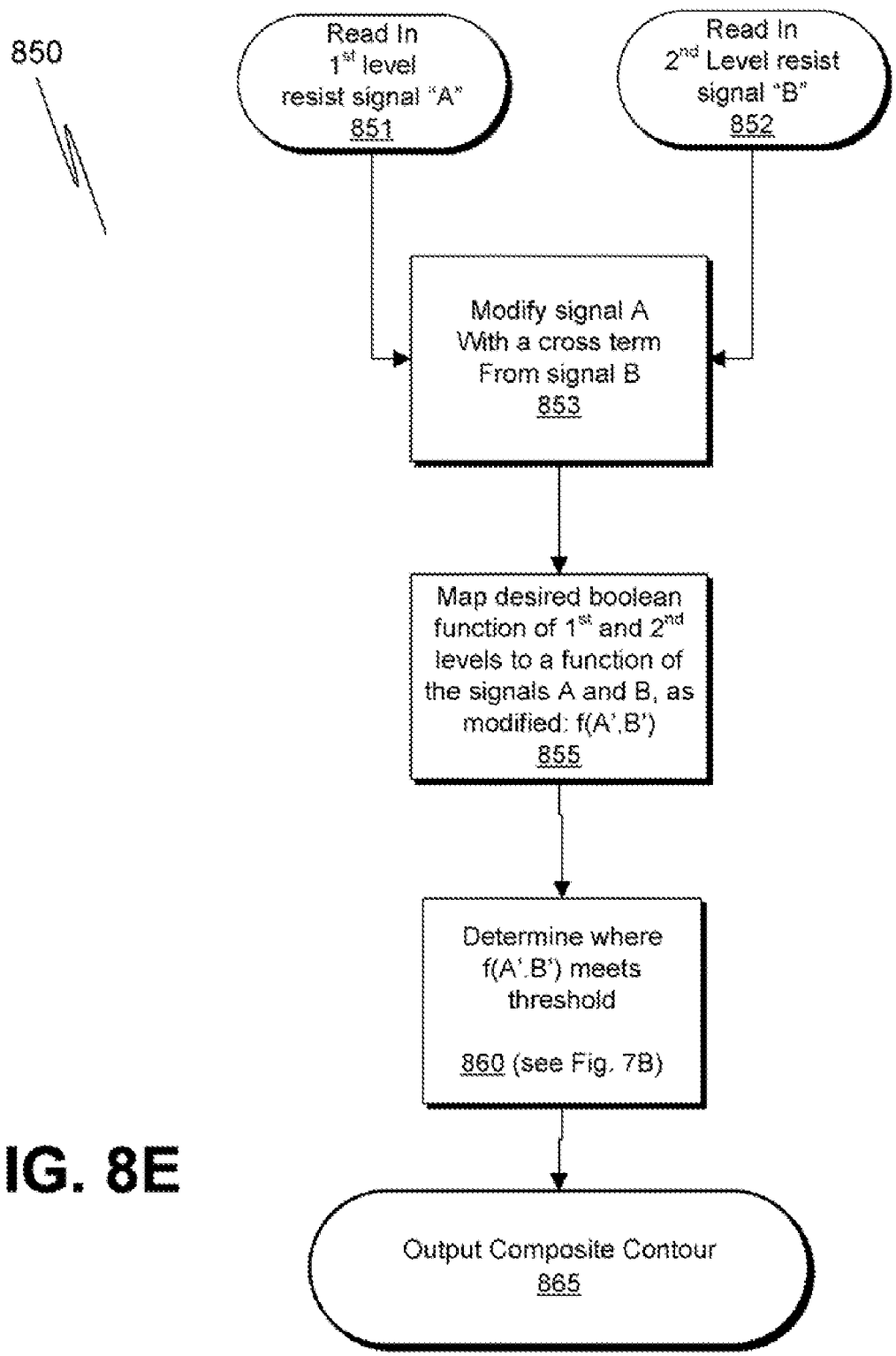
FIG. 8E illustrates a flow diagram for predicting a Boolean operation of polygons modeled for a photolithographic mask set with reduced false violations, in accordance with an embodiment.

To reduce such false violations, the method 800 is expanded in a further embodiment to include an additional operation. One or more of the image intensity signals is first modified with a cross term from the other of the image intensity signals before generating, based on a Boolean operation of the second mask level and the first mask level, a function of the image intensity signals. FIG. 8E illustrates an exemplary method 850 which begins with operations 851 and 852 at which the first and second resist signals ("A" and "B") are read in, as discussed elsewhere herein. At operation 853, at least one of the signals is modified with a cross term from the other of the resist signals. In the exemplary embodiment, both resist signals are modified with a cross term.

Generally, the cross term is to impart some dependency of one or both of the masks on the other in a double patterning mask set to capture the sequence and topography-based lithographic effects that occur during double-patterning processes. For example, as depicted in FIG. 8D, where the first level contour 271 results in a false violation, the resist signal from which the first level contour 271 was generated is modified at operation 853 to include a cross term from the resist signal B to arrive at: $A'=f_1(B)$. A similar modification can be made to the resist signal of the second patterning level to introduce a cross term from the first level resist signal to arrive at: $B'=f_2(A)$.

In one embodiment, the cross term comprises a proximity influence term which increases in magnitude as the first and second image intensity signals become more proximate to each other within the mask area. This causes the magnitude of the modification to increase with proximity (i.e., as the first and second level patterns approach colinearity), and the modified signal is to deviate from the nominal by a greater amount. In a particular embodiment, the proximity influence term in the modified image intensity signal is an exponential function of the other image intensity signal (e.g., $A'=f_1(B)=e^{(B)}$).

In a further embodiment, the cross term is applied to the resist signal as a function of a curvature or slope of the resist signal to capture second order effects that are not captured by proximity alone. Generally this term is to limit signal modification to a subset of the greatest topography of the mask level for which the signal being modified corresponds. As one embodiment, the cross term (e.g., proximity influence term) is multiplied by a curvature of the electric field (slope of signal A). For example, for a modification to first pattern level signal: $A'=f_1(B)=$Slope of $fA*e^{(B)}$) Similar treatments may be applied to the signal B in further embodiments.

Next, at operation 855, a function of the image intensity signals, as modified, is generated based on a Boolean operation of the second mask level and the first mask level substantially as described elsewhere herein for an unmodified signal. At operation 860 the composite contour from the function of the first and second image intensity signals is determined at output at operation 865 as a modified prediction of an image that results on a substrate from successively printing the first and second mask levels on the substrate.

FIG. 8C illustrates a difference contour 881 employing the method 850. As shown, many of the areas that are identified as a difference between the first and second patterns 321, 352 in FIG. 8B are no longer so identified. In this manner the method of 850 may be employed to incorporate composite mask effects into a composite contour to arrive at a better model of a double-patterning process and reduce the number of false violations.

Returning to FIG. 2, upon verification, the mask design and generation process outputs instructions from which a mask shop can manufacture the first level (grating) mask at operation 290 and the second level (plug) mask at operation 295. The masks generated may then be utilized by a microelectronics manufacturer to practice a double patterning process, such as that depicted in FIG. 1.

Embodiments of the present invention may include apparatuses for performing the operations herein. The simulation algorithms of the present invention may be implemented on a stand-alone or networked computer system based on a number of instructions that are executed by the computer(s) to simulate how a mask pattern will print on a wafer. From the estimate of how the mask pattern will print, one or more of the resolution enhancement techniques, such as OPC or subresolution assist features (SRAFs) can be used in order to produce mask pattern data that will be used to generate a mask which is projected onto a wafer to print the target pattern into a thin film layer of a microelectronic device.

An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a system bus for a computing device.

The present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., carrier waves, infrared signals, digital signals, etc.)), etc.

Figure 9:
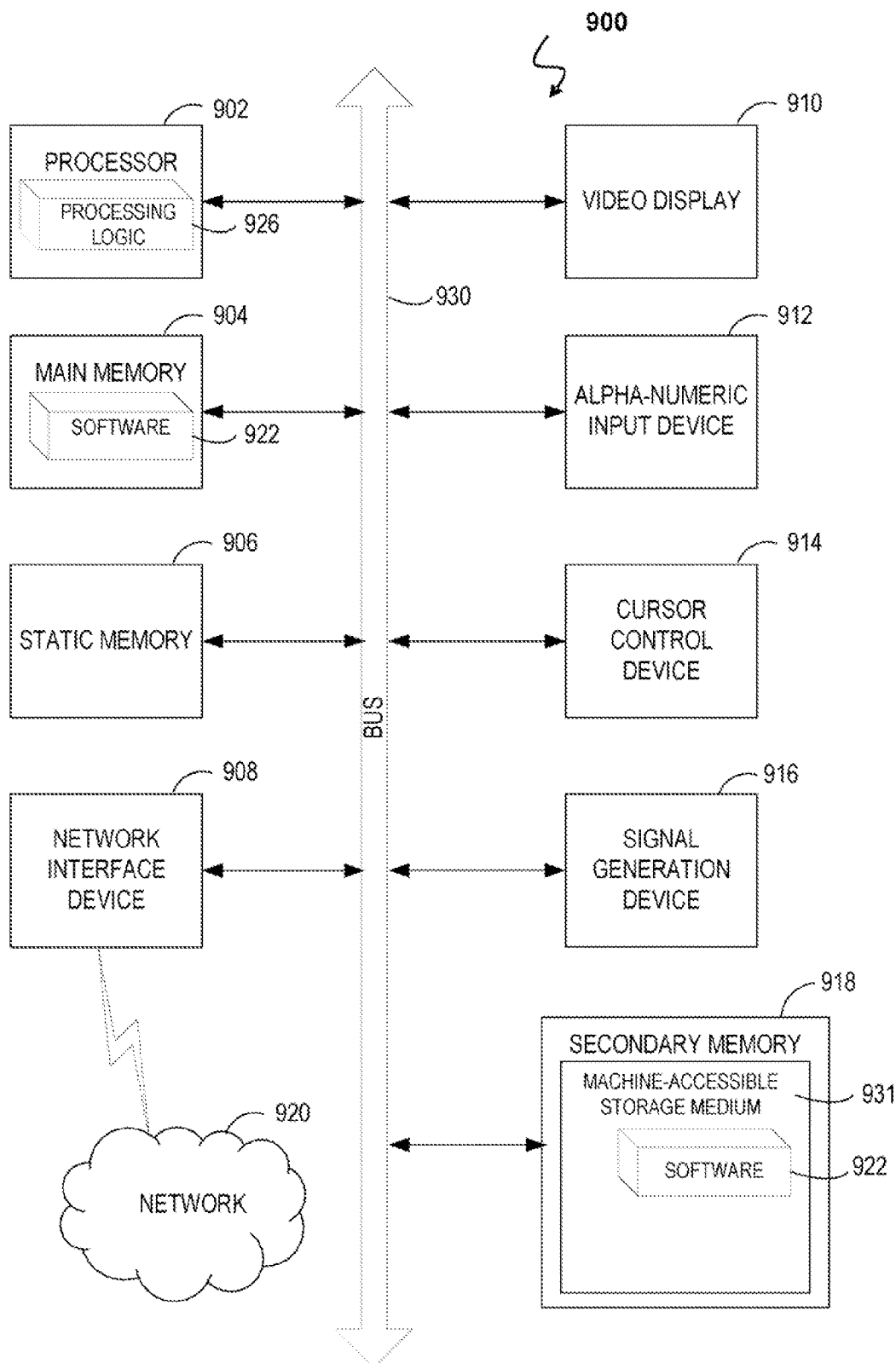
FIG. 9 illustrates a block diagram of an exemplary computer system used to practice embodiments of the present invention.

FIG. 9 illustrates a diagrammatic representation of a machine in the exemplary form of a computer system 900 within which a set of instructions, for causing the machine to perform any one or more of the design and modeling methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations and steps discussed herein.

The computer system 900 may further include a network interface device 908. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 931 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

The machine-accessible storage medium 931 may store sets of instructions (e.g., software 922) embodying any one or more of the methodologies or functions described herein. While the machine-accessible storage medium 931 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In the foregoing specification, embodiments of the invention have been described with reference to specific exemplary features thereof. It will, however, be evident that various modifications and changes may be made thereto without departing from the broader spirit and scope of the invention as set forth in the appended claims. The specification and figures are, accordingly, to be regarded in an illustrative rather than a restrictive sense.

What is claimed is:

1. A method for composing polygons of a first mask level and a second mask level into a target pattern of polygons to be formed on a substrate by sequentially printing the first mask level and the second mask level, the method comprising:

receiving a design layout defining the target pattern;

synthesizing, based on the target pattern, a sacrificial enabling pattern which, when added to the target pattern, increases a regularity of edges to approximate a diffraction grating;

generating, as the first mask level, a grating pattern to be printed on the substrate with an exposure wavelength, the grating pattern being inclusive of the target pattern and the enabling pattern; and generating, as the second mask level, a plug pattern to be printed on the substrate with the exposure wavelength, the plug pattern to remove substantially all of the sacrificial enabling pattern from the substrate while retaining the target pattern on the substrate.

2. The method as in claim 1, wherein generating the plug pattern further comprises generating plug polygons to fully cover polygons of the sacrificial enabling pattern without covering the target pattern.

3. The method as in claim 1, wherein synthesizing the sacrificial enabling pattern further comprises generating a plurality of enabling polygons which result in both the grating pattern and the plug pattern having a mask error enhancement factor (MEEF) below that of the target pattern.

4. The method as in claim 1, wherein synthesizing the sacrificial enabling pattern further comprises generating a plurality of enabling polygons, all of which can be removed by the plug pattern without generating a plug polygon touching a longest edge of a target polygon having a shortest edge drawn to a minimum dimension design rule for the target pattern.

5. The method as in claim 1, wherein the target pattern is bi-directional to include a first subset of target polygons having a longest length along a first mask dimension and a second subset of target polygons having a longest length along a second mask dimension.

6. The method as in claim 1, wherein synthesizing the sacrificial enabling pattern further comprises nesting a first target polygon, having a shortest edge drawn to a minimum dimension design rule for the target pattern, with one or more enabling polygons having an edge positioned adjacent to the longest edge of the first target polygon.

7. The method as in claim 1, wherein synthesizing the sacrificial enabling pattern further comprises extending a first length of a first target polygon with a first enabling polygon, wherein the first enabling polygon has a second length that is no greater than a second length of the first target polygon.

8. The method as in claim 7, wherein the first enabling polygon joins the first target polygon to a second target polygon.

9. The method as in claim 8, wherein the first enabling polygon joins the first target polygon to the second target polygon to eliminate an end-to-end space between the first and second target polygons drawn to a minimum dimension design rule for the target pattern.

10. The method as in claim 9, wherein the second length of the first enabling polygon is smaller than that of either the first or second target polygon.

11. The method as in claim 10, wherein the second length of the first enabling polygon is below the minimum dimension design rule for the target pattern.

12. The method as in claim 10, wherein the second length of the first enabling polygon is equal to an overlap in a first dimension between the first and second target polygons.

13. The method as in claim 7, wherein the first enabling polygon joins less than all of a longest length of the first target polygon to the second target polygon to provide a continuous edge between the first and second target polygon, wherein the continuous edge is proximate to a longest edge of a third target polygon.

14. The method as in claim 13, wherein the third target polygon has a shortest edge drawn to a minimum dimension design rule for the target pattern.

15. The method as in claim 7, wherein the first enabling polygon extends a longest edge of the first target polygon to be adjacent to the entirety of the longest edge of the first target polygon.

16. A computer readable storage medium having instructions stored thereon, which when executed by a processing system, cause the system to perform the method of claim 1.

17. A mask set comprising multiple masks which are to be sequentially printed with a same lithography technique, onto a substrate to form a target pattern of polygons, the mask set comprising:
  a first mask having a first level pattern approximating a diffraction grating pattern that is inclusive of the target pattern and a sacrificial enabling pattern, wherein the target pattern is bi-directional to include a first subset of target polygons having a longest length along a first mask dimension and a second subset of target polygons having a longest length along a second mask dimension; and
  a second mask having a second level pattern to remove from the substrate substantially all of the sacrificial enabling pattern while retaining the target pattern.

18. The mask set as in claim 17, wherein both the grating pattern and the plug pattern have a mask error enhancement factor (MEEF) below that of the target pattern.

19. The mask set as in claim 17, wherein the plug pattern removes the sacrificial enabling pattern from the grating pattern without printing a plug polygon touching a longest edge of a target polygon having a shortest edge drawn to a minimum dimension design rule for the target pattern.

20. The method as in claim 1, further comprising:
  performing a first optical proximity correction (OPC) process on the grating pattern;
  generating a model predicted grating pattern contour based on the first OPC process; and
  sizing polygons of the plug pattern with a second OPC process bounded by the model predicted grating pattern contour and the target pattern.

21. A method for synthesizing polygons of a first mask level and a second mask level into a target pattern of polygons to be formed on a substrate by sequentially printing the first mask level and the second mask level, the method comprising:
  synthesizing, based on the target pattern, a sacrificial enabling pattern;
  performing a first optical proximity correction (OPC) process on the first mask level pattern to be printed, wherein the first mask level pattern is inclusive of the target pattern and the sacrificial enabling pattern;
  determining a printing performance of the first mask level pattern;
  sizing polygons of a second mask level pattern with a second OPC process bounded by the determined printing performance of the first mask level pattern and the target pattern to remove the sacrificial enabling pattern while retaining the target pattern.

22. The method as in claim 21, wherein determining the printing performance of the first mask level pattern further comprises generating a model predicted first mask level pattern contour based on the first OPC process.

23. The method as in claim 22, wherein the second mask level pattern fully encloses the sacrificial enabling pattern and wherein the second OPC process further comprises sizing the second mask level pattern to cover portions of the model predicted first mask level pattern contour not enclosed by either the target pattern or the sacrificial enabling pattern.

24. The method as in claim 23, wherein the second OPC process is to size the second mask level pattern to overcome overlay errors between the first and second mask level patterns.

25. The method as in claim 24, further comprising generating the second mask level pattern based on the sacrificial enabling pattern to cover the sacrificial enabling pattern.

26. The method as in claim 25, wherein performing the second OPC process further comprises:
  segmenting polygons of the second mask level pattern;
  determining, for each segment, a distance between the first mask level pattern contour and second mask level pattern contour;
  determining for each segment, a distance to the nearest target pattern edge; and
  displacing the segment depending on the relationship of the determined distances to the target pattern and to the first pattern contour.

27. The method as in claim 26, wherein the segment is displaced to maintain a minimum distance between the segment and the target pattern.

28. The method as in claim 27, wherein the segment is displaced to be outside of the sacrificial enabling pattern and wherein the determined distances indicate the nearest first mask level pattern contour is outside of the sacrificial enabling pattern and the target pattern by more than a threshold tolerance.

29. The method as in claim 21, wherein the target pattern is bi-directional to include a first subset of target polygons having a longest length along a first mask dimension and a second subset of target polygons having a longest length along a second mask dimension.

30. The method as in claim 29, wherein the first mask level pattern approximates a grating having a lower mask error enhancing factor (MEEF) than does the target pattern.

31. A computer readable storage medium having instructions stored thereon, which when executed by a processing system, cause the system to perform the method of claim 23.

* * * * *